United States Patent [19]

Hastings

[11] 4,050,148
[45] Sept. 27, 1977

[54] SNAP-IN BUSHING SWITCH REMOVAL TOOL

[75] Inventor: Jerome K. Hastings, Sussex, Wis.

[73] Assignee: Cutler-Hammer, Inc., Milwaukee, Wis.

[21] Appl. No.: 695,915

[22] Filed: June 14, 1976

[51] Int. Cl.² .............................................. B25B 27/14
[52] U.S. Cl. ...................................... 29/764; 29/278; 274/1 E
[58] Field of Search ............ 29/200 D, 200 H, 203 H, 29/235, 278, 427, 758, 764; 279/1 E, 43, 50

[56] References Cited

U.S. PATENT DOCUMENTS

| | | | |
|---|---|---|---|
| 1,458,359 | 6/1923 | Riley | 279/1 E |
| 2,415,482 | 2/1947 | Greenough | 279/1 E |
| 3,210,836 | 10/1965 | Johanson et al. | 29/278 |
| 3,903,577 | 9/1975 | Phillips | 29/203 H |

Primary Examiner—Othell M. Simpson
Assistant Examiner—Z. R. Bilinsky
Attorney, Agent, or Firm—Hugh R. Rather; William A. Autio; Michael E. Taken

[57] ABSTRACT

A tool for removing a snap-in bushing type toggle switch from a hole in a mounting panel. The tool is made of metal or plastic and is provided with a spring-biased self-opening chuck and compressor tube adapted to squeeze the snap-in collar or skirt of the snap-in bushing so that it can be pushed back through the hole in the panel for removal. An outer, compressor tube having a mushroom handle at one end is adapted to slide forwardly over the chuck to compress or squeeze it and the snap-in collar therewithin. A spring-biased ejector pin within the chuck is depressed by the toggle lever and serves to snap the switch out upon release of the snap-in collar. The tool is used by placing the chuck over the snap-in bushing against the panel and pressing on the mushroom handle to slide the compressor tube over the chuck against the panel whereupon the ejector pin kicks the switch out behind the panel.

A simpler version includes only a chuck and a manually slidable compressor ring, both molded of plastic material. The chuck is placed over the snap-in bushing and the compressor ring is slid up against the panel whereupon the switch can be grasped and removed from the other side of the panel.

7 Claims, 5 Drawing Figures

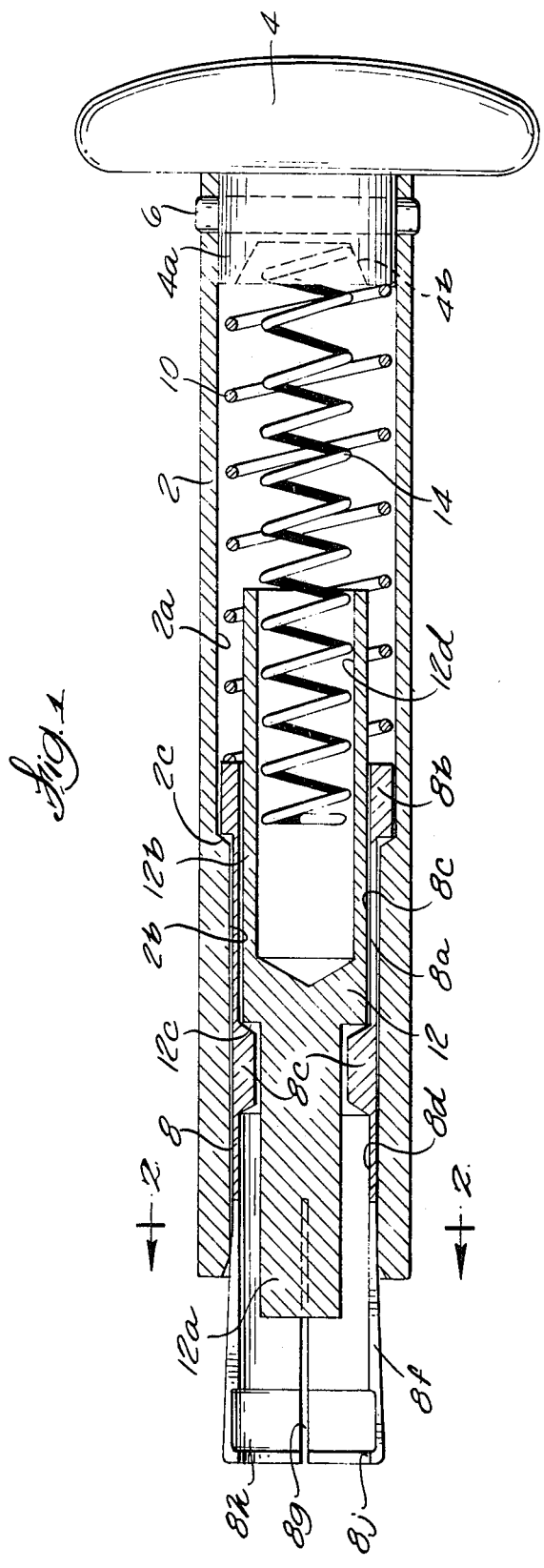
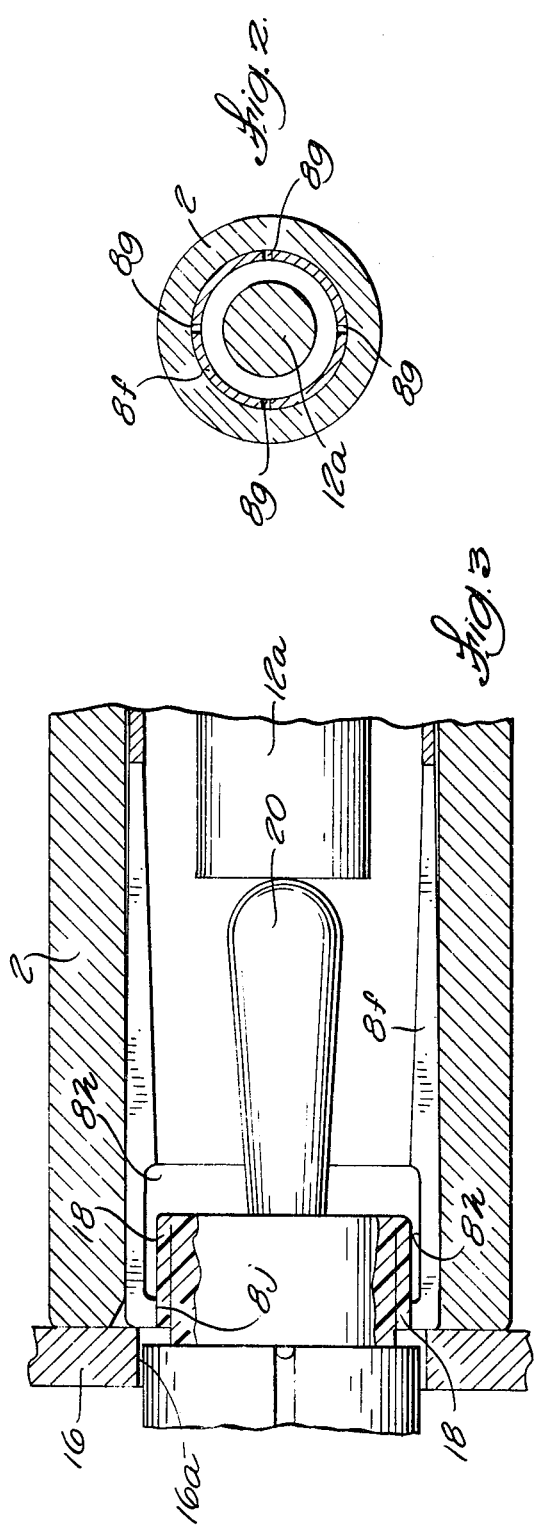

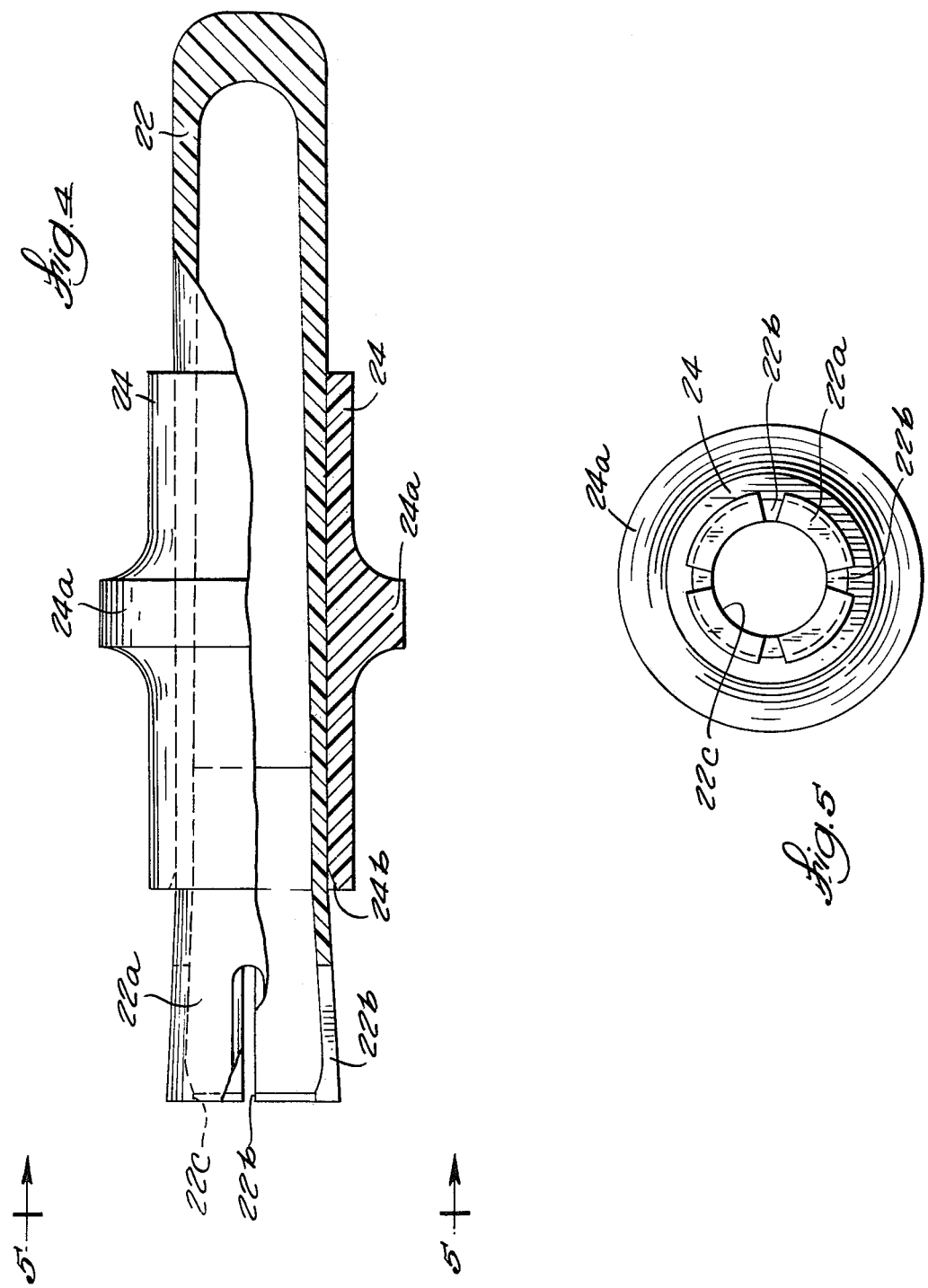

SNAP-IN BUSHING SWITCH REMOVAL TOOL

BACKGROUND OF THE INVENTION

In the use of snap-in bushing type toggle switches such as disclosed in E. T. Piber U.S. Pat. No. 3,941,965, dated Mar. 2, 1976, and assigned to the assignee of this invention, it has been found desirable at times to remove these switches from the mounting panel. Due to the stiffness or semi-rigid nature of the plastic material from which the snap-in collar or skirt is made, difficulty has been encountered in attempts to squeeze it sufficiently to release it from the hole in the mounting panel. Switch removal has been attempted by use of a tube having a bore no larger than the hole in the panel. However, pushing such tube over the snap-in collar or skirt to squeeze it has a tendency to scrape and deform the collar and to spread out and flare its panel-contacting periphery even more on the front of the panel and to pinch its periphery between such tube and the face of the panel thereby damaging the collar while failing to release the switch. Consequently, it has been found desirable to provide a removal tool that will effect quick removal of the switch without damaging the same.

SUMMARY OF THE INVENTION

An object of the invention is to provide a removal tool for a snap-in bushing switch that will effect quick removal of the switch from its hole in the mounting panel.

A more specific object of the invention is to provide an automatic removal tool of the aforementioned type that will automatically eject the switch out on the other side of the panel.

Another specific object of the invention is to provide a manual removal tool of the aforementioned type that will release the switch so that it can be manually removed from the rear of the panel.

Another specific object of the invention is to provide removal tools of the aforementioned types that are simple in construction and efficient in operation.

Other objects and advantages of the invention will hereinafter appear.

BRIEF DESCRIPTION OF THE DRAWINGS

FIG. 1 is an enlarged longitudinal cross-sectional view of an automatic version of a snap-in bushing switch removal tool constructed of metal and showing the internal parts and springs thereof.

FIG. 2 is a lateral cross-sectional view taken along line 2—2 of FIG. 1 showing the round configuration of the parts; and FIG. 3 is a greatly enlarged fragmentary longitudinal cross-sectional view of the left-hand end of the tool of FIG. 1 showing application thereof to release of a switch from a panel hole.

FIG. 4 is an enlarged, longitudinal, partly cross-sectional view of a simpler and more economical, molded plastic, manual version of the removal tool constructed in accordance with the invention; and FIG. 5 is a left end view of the removal tool of FIG. 4 showing the circular configuration of the parts.

DESCRIPTION OF THE PREFERRED EMBODIMENT

Referring to FIGS. 1-3, there is shown a removal tool for a snap-in bushing toggle switch constructed in accordance with the invention. The tool as illustrated therein is an all-metal version. This removal tool is provided with an external compressor tube 2 having a mushroom handle 4 secured at one end by a slotted spring pin 6 or the like. A tubular chuck member 8 is arranged within the compressor tube for limited extension therefrom and is biased in the left-hand direction by a chuck-return, helical spring 10 compressed between stem 4a of the handle and the annular inner end of the chuck member. An ejector pin 12 is arranged within chuck member 8 for limited movement and extends within return spring 10 and is arranged for lost-motion engagement of and compression of a helical, ejector spring 14 concentrically within spring 10 and held between stem 4a of the handle and the ejector pin.

Compressor tube 2 and chuck member 8 are provided with cooperating means for retaining the chuck member within the compressor tube for limited extension therefrom. For this purpose, compressor tube 2 is provided with a stepped bore having a larger diameter bore 2a at its right-hand portion and a smaller diameter bore 2b at its left-hand portion joined at slightly beveled, annular shoulder 2c. The chuck member is tubular and is provided with a stepped outer surface to fit the stepped bore of the compressor tube. For this purpose, chuck member 8 is provided with a uniform outer diameter throughout its intermediate portion 8a terminating in an enlarged diameter, annular collar 8b at its right-hand end. As shown in FIG. 1, intermediate portion 8a is slid into smaller diameter bore 2b of the compressor tube and collar 8b stops against shoulder 2c to limit the extension of the left end of the chuck member from the compressor tube. Chuck-return spring 10 is then inserted into the right-hand end of the compressor tube to abut the internal, collared end of the chuck member.

Chuck member 8 and ejector pin 12 are provided with cooperating means for retaining the ejector pin within the tubular chuck member for limited movement. This means comprises an annular, intermediate constriction, 8c having slightly beveled, annular ends and separating uniform, larger-diameter bores 8d and 8e on opposite sides thereof with bore 8e extending from such constriction all the way to the inner end of the chuck member. For cooperation therewith, ejector pin 12 has a solid, reduced-diameter left-hand end portion 12a and a larger diameter right-hand end portion 12b separated by an annular shoulder 12c. The reduced-diameter end portion passes freely through the reduced bore within constriction 8c and the larger-diameter end portion slides freely in bore 8e of the chuck member while shoulder 12c of the ejector pin stops against constriction 8c. This larger-diameter end portion 12b has a bore 12d for receiving one end of ejector spring 14 while its other end rests in a frusto-conical recess 4b in the end of stem 4a of handle 4. As shown in FIG. 1, ejector spring 14 is a predetermined amount shorter than the maximum length of the space between handle recess 4b and the bottom of bore 12d to provide suitable lost motion to accommodate the longest toggle lever while also providing sufficient ejection force for the shortest toggle lever in the range of actuator levers used.

The left-hand, external end of the chuck that normally projects out from the compressor tube is provided with means for embracing and squeezing the snap-in skirt of the switch when the compressor tube is slid thereover. This means comprises a divided and flared section such as a quadriformed, self-spreading chuck porton 8f having a bore that is a continuation of and equal in diameter to bore 8d and four elongated, radial slits 8g spaced 90° from one another to divide this chuck portion into a quadriform as shown in FIG. 2. The outer diameter of this chuck portion slightly increases so as to provide a gradual increase in thickness of the quadriform portions toward the left end. A flat-ring-shaped cutout or enlargement 8h of bore 8d is slightly spaced from the left end of chuck portion 8f, this cutout being wide enough, as shown in FIG. 3, to overlap the tips of the whole range of heights used for the snap-in skirts on these switches. The lip 8j at the extreme end of the chuck portion is provided with a diameter slightly larger than bore 8d to facilitate insertion thereof without scraping over the flared skirt of the snap-in bushing of the switch. However, the diameter of this lip 8j is smaller than cutout 8h so as to afford squeezing of the flared edge of the snap-in skirt immediately adjacent panel 16 small enough to re-enter hole 16a in the panel without having to apply enough force to squeeze the snap-in skirt throughout its entire length. Once this skirt is started going through panel hole, this lip will squeeze the rest of it as the ejector pin snaps the switch out behind the panel.

As shown in FIG. 3, when chuck portion 8f is placed around shap-in skirt 18 of the toggle switch against panel 16 and handle 4 is pressed, compressor tube 2 slides over the diverging-diameter portion of the chuck and compresses the quadriform parts thereof radially inward. At the same time, toggle lever 20 of the switch engages left end 12a of ejector pin 12 and depresses the pin to take up the lost motion and depress spring 14. As the chuck is cammed inwardly, lip 8j squeezes the edge of snap-in skirt 18 small enough so that it will enter hole 16a in the panel. Ejector pin 12 under the force of its spring 14 then ejects the switch out behind the panel. When the tool is removed from the panel, spring 10 restores chuck member 8 to the position shown in FIG. 1 and chuck portion 8f self-expands.

To assemble the tool, chuck member 8 is first inserted into the compressor tube followed by spring 10 whereby the chuck member is pushed all the way against the shoulder. Ejector pin 12 is then inserted within the chuck member and ejector spring 14 is dropped into bore 12d in the internal end of the pin. The stem of handle 4 is then inserted into the right end of the compressor tube, compressing spring 10 and slotted spring pin 6 is pressed into the hole in the compressor tube and the handle stem to be frictionally held therein by its self-expansion.

FIGS. 4 and 5 show a simple, plastic version of a removal tool that comprises only two molded pieces including a chuck member 22 and a compressor ring 24. With this version, the chuck end of the chuck member is placed around the snap-in collar of the switch against the panel and the compressor ring is then slid forward against the panel to compress the chuck end and the snap-in collar therewithin. The switch may then be grasped at the rear of the panel and removed.

Chuck member 22 comprises a molded tube closed and rounded at its right-hand end and having a quadriformed chuck 22a at its left end. This quadriform is provided by four elongated, radial, outwardly diverging slits 22b extending from the left-hand end of the chuck member and spaced 90° apart. This quadriform chuck portion is provided with a slightly increasing external and internal diameter terminating in a thicker section providing a reduced internal diameter forming a lip 22c for compressing the snap-in collar of the switch immediately adjacent the panel. As shown in FIG. 5, slits 22b are radially flared to facilitate molding thereof.

Compressor ring 24 is generally tubular in shape having a thickened, sloping-sided, annular flange or ridge 24a around its intermediate portion whereby it may be grasped to push it along the chuck member. The forward end of the bore within compressor ring 24 is provided with a bevel 24b to facilitate entry thereof over chuck 22a without scraping. Upon release of the switch from the removal tool and retraction of compressor ring 24, chuck 22a self-expands to afford re-use thereof in removal of another switch.

While the apparatus hereinbefore described is effectively adapted to fulfill the objects stated, it is to be understood that the invention is not intended to be confined to the particular preferred embodiments of snap-in bushing switch removal tools disclosed, inasmuch as they are suscetible of various modifications without departing from the scope of the appended claims.

I claim:

1. A removal tool for releasing a snap-in bushing switch from its hole in a mounting panel comprising:
    an elongated tubular compressor member having an open forward end and a closed rear end;
    an elongated hollow chuck member in said tubular compressor member and having a divided and flared tubular section at its forward end forming a chuck normally projecting out from the open forward end of said tubular compressor member into its extended position and being rearwardly slidable within said tubular compressor member, said chuck being adapted to be placed about the snap-in bushing collar of a switch and to squeeze it small enough to re-enter the hole in the mounting panel for release therefrom;
    a return spring within the rear portion of said tubular compressor member biasing said chuck member forwardly into its extended position;
    a chuck stop between said compressor member and said chuck member limiting the amount that said chuck member extends from the forward end of said compressor member;
    an ejector pin slidable within said chuck member and a stop therebetween that limits the forward movement of said ejector pin with respect thereto to retain it therewithin;
    and an ejector operating spring between said compressor member and said ejector pin compressible upon forward sliding movement of said compressor member relative to said chuck member;
    said chuck being adapted to be pressed against a mounting panel around the snap-in bushing collar of a panel-mounted switch to cause the switch actuator to depress said ejector pin whereafter depression of said compressor member causes the forward end thereof to slide over said chuck against the panel and to constrict said divided and flared section and causes said ejector operating spring to be compressed thereby to cause said chuck to squeeze the snap-in bushing collar of the switch small enough to allow said ejector pin to snap the switch out of the panel hole.

2. The removal tool defined in claim 1, wherein:
    said divided and flared tubular section comprises a quadriformed tubular section having an external diameter that increases toward said one end.

3. The removal tool defined in claim 2, wherein:

the internal diameter of said quadriform section is substantially uniform except for the extremity of said forward end which has an internal lip for engaging the snap-in bushing collar immediately adjacent the mountin panel.

4. The removal tool defined in claim 3, wherein:
said quadriform section is provided with an internal, generally annular groove extending back from said lip to overlap a predetermined range of different heights of snap-in bushing collars that are used in switches.

5. The removal tool defined in claim 1, wherein:
said compressor member comprises a handle at its rear end adapted to fit the palm of the user when the latter pushes it against the mounting panel.

6. The removal tool defined in claim 1, wherein:
said divided and flared tubular section comprises a multi-split resilient self-spreading chuck that is placed around the snap-in bushing collar against the panel,
and said compressor member is a tight-fitting member slidable over said flared end to squeeze the multi-split parts and the snap-in bushing collar therewithin to release the switch from the panel hole.

7. The removal tool defined in claim 1, wherein:
said ejector pin operating spring has a length affording predetermined lost motion of said ejector pin when depressed by the switch actuator thereby to provide for use with a range of different lengths of switch actuators.

* * * * *